United States Patent
Tirapu-Azpiroz et al.

(10) Patent No.: US 8,059,885 B2
(45) Date of Patent: Nov. 15, 2011

(54) CALCULATING IMAGE INTENSITY OF MASK BY DECOMPOSING MANHATTAN POLYGON BASED ON PARALLEL EDGE

(75) Inventors: Jaione Tirapu-Azpiroz, Poughkeepsie, NY (US); Kafai Lai, Poughkeepsie, NY (US); David O. S. Melville, New York, NY (US); Alan E. Rosenbluth, Yorktown Heights, NY (US); Kehan Tian, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 973 days.

(21) Appl. No.: 12/015,768

(22) Filed: Jan. 17, 2008

(65) Prior Publication Data

US 2009/0185740 A1 Jul. 23, 2009

(51) Int. Cl.
G06K 9/00 (2006.01)
(52) U.S. Cl. .................................. 382/145; 382/144
(58) Field of Classification Search .................. 382/173, 382/144–145, 279; 378/34, 35
See application file for complete search history.

(56) References Cited

U.S. PATENT DOCUMENTS

| | | | |
|---|---|---|---|
| 7,079,223 | B2 | 7/2006 | Rosenbluth et al. |
| 7,155,698 | B1 * | 12/2006 | Gennari ........................... 716/53 |
| 2004/0122636 | A1 | 6/2004 | Adam | 
| 2006/0009957 | A1 | 1/2006 | Kohle |
| 2006/0126046 | A1 | 6/2006 | Hansen |
| 2006/0248498 | A1 | 11/2006 | Sezginer et al. |

OTHER PUBLICATIONS

Adam, "Modeling of Electromagnetic Effects from Mask Topography at Full-Chip Scale", Proceedings of SPIE, vol. 5754, 2005, pp. 498-505.
Bai et al., "Approximation of Three-Dimensional Mask Effects with Two-Dimensional Features", Proceedings of SPIE, vol. 5751, 2005, pp. 446-454.
Erdmann, "Mask Modeling in the Low K1 and Ultrahigh NA Regime: Phase and Polarization Effect", Proceedings of SPIE, vol. 5835, 2005, pp. 69-81.
Lam et al., "Domain decomposition methods for simulation of printing and inspection of phase defects", Proceedings of SPIE, vol. 5040, 2003, pp. 1492-1501.
Tirapu-Azpiroz et al., "Boundary Layer Model to Account for Thick Mask Effects in PhotoLithography", Proceedings of SPIE, vol. 5040, 2003, pp. 1611-1619.

* cited by examiner

*Primary Examiner* — Daniel Mariam
(74) *Attorney, Agent, or Firm* — Yuanmin Cal; Hoffman Warnick LLC

(57) ABSTRACT

A method, system, computer program product and table lookup system for calculating image intensity for a mask used in integrated circuit processing are disclosed. A method may comprise: decomposing a Manhattan polygon of the mask into decomposed areas based on parallel edges of the Manhattan polygon along only one dimension; determining a convolution of each decomposed area based on a table lookup; determining a sum of coherent systems contribution of the Manhattan polygon based on the convolutions of the decomposed areas; and outputting the determined sum of coherent system contribution for analyzing the mask.

25 Claims, 7 Drawing Sheets

CALCULATING IMAGE INTENSITY OF MASK BY DECOMPOSING MANHATTAN POLYGON BASED ON PARALLEL EDGE

BACKGROUND OF THE DISCLOSURE

1. Technical Field

The present invention relates generally to optical lithography, and more particularly to calculating image intensity of a mask by decomposing a Manhattan polygon based on parallel edges.

2. Background Art

The design of Very-Large Scale Integrated (VLSI) or Ultra-Large Scale Integrated (ULSI) circuits requires analysis of the images produced by projection lithography systems. Due to the scale of this analysis, large computational resources are required. Using the information specific to the object (i.e., the mask) in a lithographic system, techniques have been developed to quickly generate the resulting intensity at a location of interest on the imaging plane. These techniques are widely utilized in model-based optical proximity correction (OPC) to determine the appropriate compensating adjustments to the integrated circuit (IC) shapes deployed on the mask. The mask can, in almost all cases, be represented as a number of two-dimensional (2D) polygon apertures. Such 2D polygons neglect the finite thickness of the mask film structure, and are thus known as a thin-mask representation. When the true finite-thickness topography is included, the mask is referred to as a topographic mask. A fast method for generating the impact at an image point from a polygon is derived from the Hopkins model. Two techniques are usually combined together to achieve a high-speed simulation module: Sum Of Coherent Systems (SOCS) decomposition and table lookup for convolution. In the SOCS decomposition, partial coherent imaging under the Hopkins model is approximately decomposed into an incoherent sum of a relatively small number of coherent sub-images. Here the term "sub-image" refers to the convolution of an eigenvector kernel of the Hopkins Integral (used in the Hopkins model) with the object, an operation equivalent to calculating a coherent image. The full image is obtained as the incoherent sum of the sub-images. Such an eigenvector kernel is referred to as a SOCS kernel. A table lookup will reduce the computational expense to obtain the coherent sub-image since each mask polygon can be decomposed into a superposition of unbounded sectors, and the coherent sub-images of each kind of unbounded sector are pre-computed and stored in a table.

In most cases the polygons are Manhattan polygons, whose edges are rectilinear with respect to the boundaries of the rectangular IC chip, with directions being referred to as either horizontal or vertical. Only one type of unbounded sector, i.e., a quarter-plane element, is needed to synthesize the internal area of a Manhattan polygon. Where structures are periodic (or assumed periodic for simulation purposes), the quarter-plane element needs not actually extend indefinitely to occupy an entire quadrant of the unbounded 2D mask plane, but may instead be terminated at the period boundaries. For simplicity the term "quarter-plane" will be used to refer to such elements used under either option.

Conventionally, as shown in FIG. 1, an arbitrary polygonal area 10 of Manhattan form (shown as shaded area) in the left part of FIG. 1 can be formed by superposing (or be decomposed into) quarter-planes 12a-12h (each may be generally referred to as quarter-plane 12) defined by each corner 11a-11h (each may be generally referred to as a corner 11) of polygon 10, respectively. Note that quarter-planes 12 must be superposed with alternately positive and negative sign (as shown by the "+" and "−" references in FIG. 1) to indicate whether a quarter-plane is added or subtracted from the mask plane. When quarter-planes 12 are added or subtracted from the mask plane in this way, the net residual added area is positive, and takes the form of the desired polygonal area 10.

In the conventional table lookup scheme, the lookup tables store the coherent sub-images of quarter-plane elements addressed by only a single coordinate point, e.g., the lower left corner (as shown in FIG. 1) or upper left corner of quarter-plane elements 12, as convolved with kernels from a Hopkins Matrix (or integral), and is called a corner lookup scheme. The way in which quarter-planes are used for the convolution is based on the decomposition method for Manhattan polygons described above with respect to Manhattan polygon 10 of FIG. 1. Without loss of generality, a quarter-plane 12's lower left corner is defined by a corner 11 of Manhattan polygon 10. Because of the linearity of SOCS approximation, the convolution between a Manhattan polygon and a kernel can be decomposed to the convolutions between quarter-plane elements 12 addressed by corners 11 of polygon 10 and the kernel, and all these convolutions that might be encountered will be pre-computed and stored in a lookup table(s).

Access to the lookup table during OPC involves a more-or-less random selection of entries, and in general random access to large data tables entails delays that are quite long on the time-scale of central processing unit (CPU) operations. As a result, the speed of today's OPC technology is strongly gated by memory access delays. OPC processing on each single chip layer currently requires many days or even weeks of processing on very large state-of-the-art computer clusters, which limits the speed at which semiconductor products can be produced.

As mask features get smaller and smaller, electromagnetic effects (EMF) will have a more and more substantial impact on the image calculation. When mask features are large compared to the wavelength, only consideration of the interior areas of the mask features is required when calculating the image, and the finite thickness of the mask films (which manifests itself as a topographic discontinuity at feature edges) can be ignored. This simple model maintains some accuracy even at the fine dimensions of today's IC features because lithographic masks are formed at an enlarged scale (typically 4× enlarged) and their polygonal features are demagnified by several folds when projected onto the wafer to form the circuit features. Even so, state-of-the-art simulations for OPC require that the EMF effects be accounted for, at least approximately. In the prior-art, the complex electromagnetic iteration between the incident illumination wave and the mask topography has been shown to be highly localized to the vicinity of the mask topography edges. Based on this observation, imaging with EMF considered is carried out by adding localized adjustments to the edges of the polygons. Examples of such adjustments include the Boundary Layer method (BL) and the edge-based Domain Decomposition Method (DDM). Until recently, the convolution of such an adjustment with each SOCS kernel requires an additional table lookup of a separate table. In addition, in the usual case of unpolarized illumination, it was necessary to calculate separate images for each independent polarization component of the illumination, and then combine them to form the complete image.

SUMMARY

A first aspect of the disclosure is directed to a method for calculating image intensity for a mask used in integrated circuit processing, the method comprising: decomposing a Manhattan polygon of the mask into decomposed areas based on parallel edges of the Manhattan polygon along only one dimension; determining a convolution of each decomposed area based on a table lookup; determining a sum of coherent systems contribution of the Manhattan polygon based on the convolutions of the decomposed areas; and outputting the determined sum of coherent system contribution for analyzing the mask.

A second aspect of the disclosure is directed to a system for calculating image intensity for a mask used in integrated circuit processing, the system comprising: at least one computing device comprising; a Manhattan decomposing unit for decomposing a Manhattan polygon of the mask into decomposed areas based on parallel edges of the Manhattan polygon along only one dimension; a table lookup unit for determining a convolution of each decomposed area based on a table lookup; and a combining unit for determining a sum of coherent systems contribution of the Manhattan polygon based on the convolutions of the decomposed areas.

A third aspect of the disclosure is directed to a computer program product for calculating image intensity for a mask used in integrated circuit processing, comprising computer usable program code stored in a non-transitory computer readable medium, which, when executed by a computer system, enables the computer system to: decompose a Manhattan polygon of the mask into decomposed areas based on parallel edges of the Manhattan polygon along only one dimension; determine a convolution of each decomposed area based on a table lookup; and determine a sum of coherent systems contribution of the Manhattan polygon based on the convolutions of the decomposed areas.

A fourth aspect of the disclosure is directed to a table lookup system for calculating image intensity for a mask used in integrated circuit processing, the table lookup system comprising: a database storing pre-calculated coherent sub-images based on a Manhattan polygon decomposition scheme; and a table lookup engine which executes following a table lookup scheme established based on decomposing a Manhattan polygon of the mask into decomposed areas based on parallel edges of the Manhattan polygon along only one dimension wherein the table look up engine determines a convolution of each decomposed area.

Other aspects and features of the present disclosure, as defined solely by the claims, will become apparent to those ordinarily skilled in the art upon review of the following non-limited detailed description of the disclosure in conjunction with the accompanying figures.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION OF THE DISCLOSURE

The following detailed description of embodiments refers to the accompanying drawings, which illustrate specific embodiments of the disclosure. Other embodiments having different structures and operations do not depart from the scope of the present disclosure.

1. Computer Environment

Figure 2:
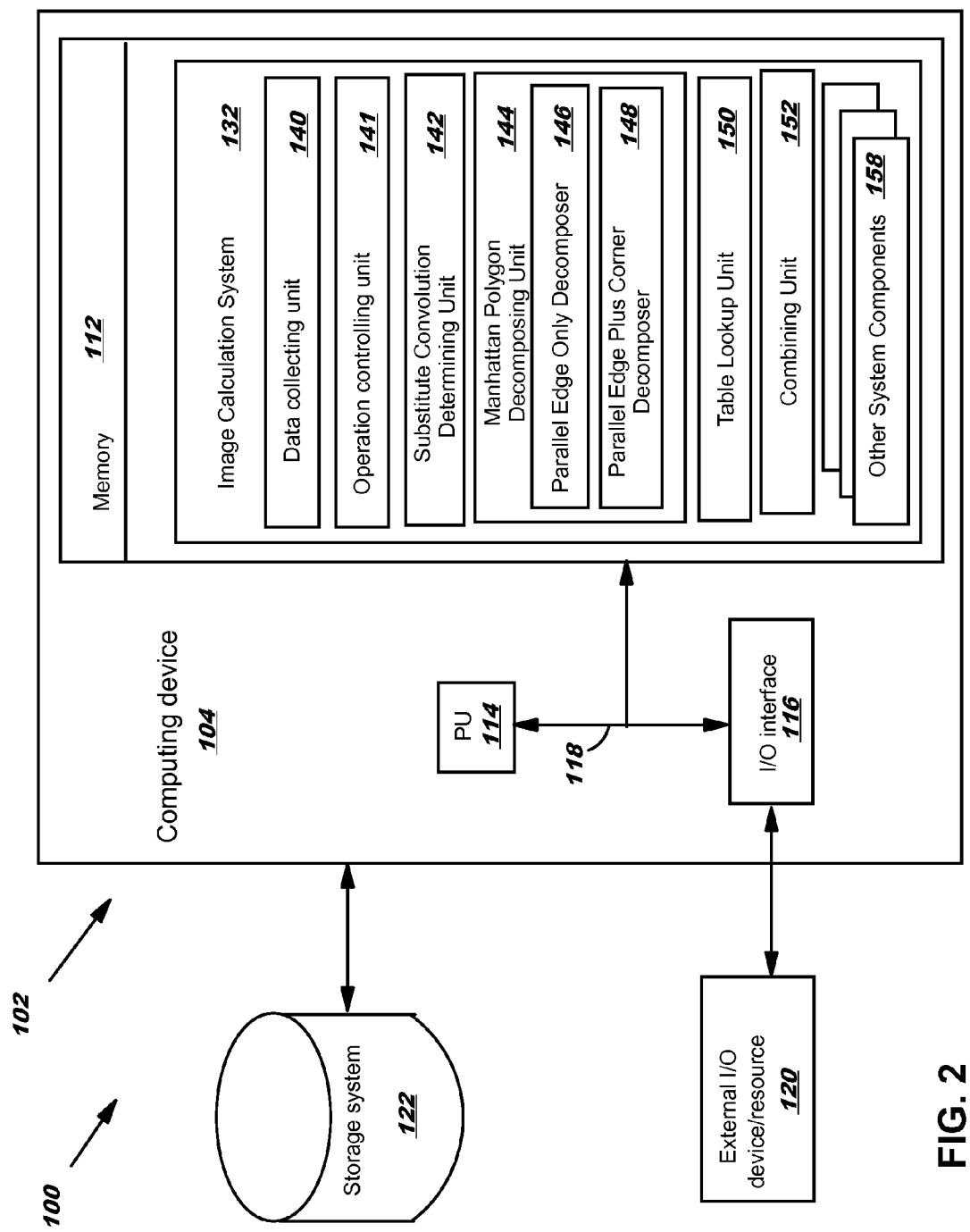
FIG. 2 shows embodiments of an image calculation system according to the disclosure.

FIG. 2 shows an illustrative environment 100 for calculating image density of a mask. To this extent, environment 100 includes a computer infrastructure 102 that can perform the various processes described herein for calculating the image intensity. In particular, computer infrastructure 102 is shown including a computing device 104 that comprises an image calculation system 132, which enables computing device 104 to perform the process(es) described herein.

Computing device 104 is shown including a memory 112, a processing unit (PU) 114, an input/output (I/O) interface 116, and a bus 118. Further, computing device 104 is shown in communication with an external I/O device/resource 120 and a storage system 122. In general, PU 114 executes computer program code, such as image calculation system 132, that is stored in memory 112 and/or storage system 122. While executing computer program code, PU 114 can read and/or write data to/from memory 112, storage system 122, and/or I/O interface 116. Bus 118 provides a communications link between each of the components in computing device 104. I/O interface 116 can comprise any device that enables a user to interact with computing device 104 or any device that enables computing device 104 to communicate with one or more other computing devices. External I/O device/resource 120 can be coupled to the system either directly or through I/O interface 116.

In any event, computing device 104 can comprise any general purpose computing article of manufacture capable of executing computer program code installed thereon. However, it is understood that computing device 104 and image calculation system 132 are only representative of various possible equivalent computing devices that may perform the various processes of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in an embodiment, computer infrastructure 102 comprises two or more computing devices that communicate over any type of wired and/or wireless communications link, such as a network, a shared memory, or the like, to perform the various processes of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

Image calculation system 132 includes a data collecting unit 140; an operation controlling unit 141; a substitute convolution determining unit 142; a Manhattan polygon decomposing unit 144 including parallel edge only decomposer 146 and parallel edge plus corner decomposer 148; a table lookup unit 150; a combining unit 152; and other system components 158. Other system components 158 may include any now known or later developed parts of a computer system required for image calculation system 132 but not individually delineated herein and understood by those skilled in the art. As should be appreciated, components of computer infrastructure 102 and/or image calculation system 132 may be located at different physical locations or at the same physical location.

Memory 112 and/or storage system 122 may store a database of pre-calculated sub-images for table lookup. The sub-images are calculated based on the Manhattan polygon decomposition schemes described herein. In addition, Manhattan polygon decomposing unit 144 and a table lookup unit 150 may be part of a table lookup engine (not shown) that operates/executes according to the operational methodology and/or table lookup schemes described herein.

Inputs to computer infrastructure 102, e.g., through external I/O device/resource 120 and/or I/O interface 116, may include a mask design for an integrated circuit. The input data may be collected by data collecting unit 140 and may be analyzed by image calculation system 132. Outputs of computer infrastructure 102 may include calculated image intensity of the input mask design, which may be used by, e.g., a model-based optical proximity correction. The operation of image calculation system 132 will be described herein in detail.

2. Operation Methodology

Figure 3:
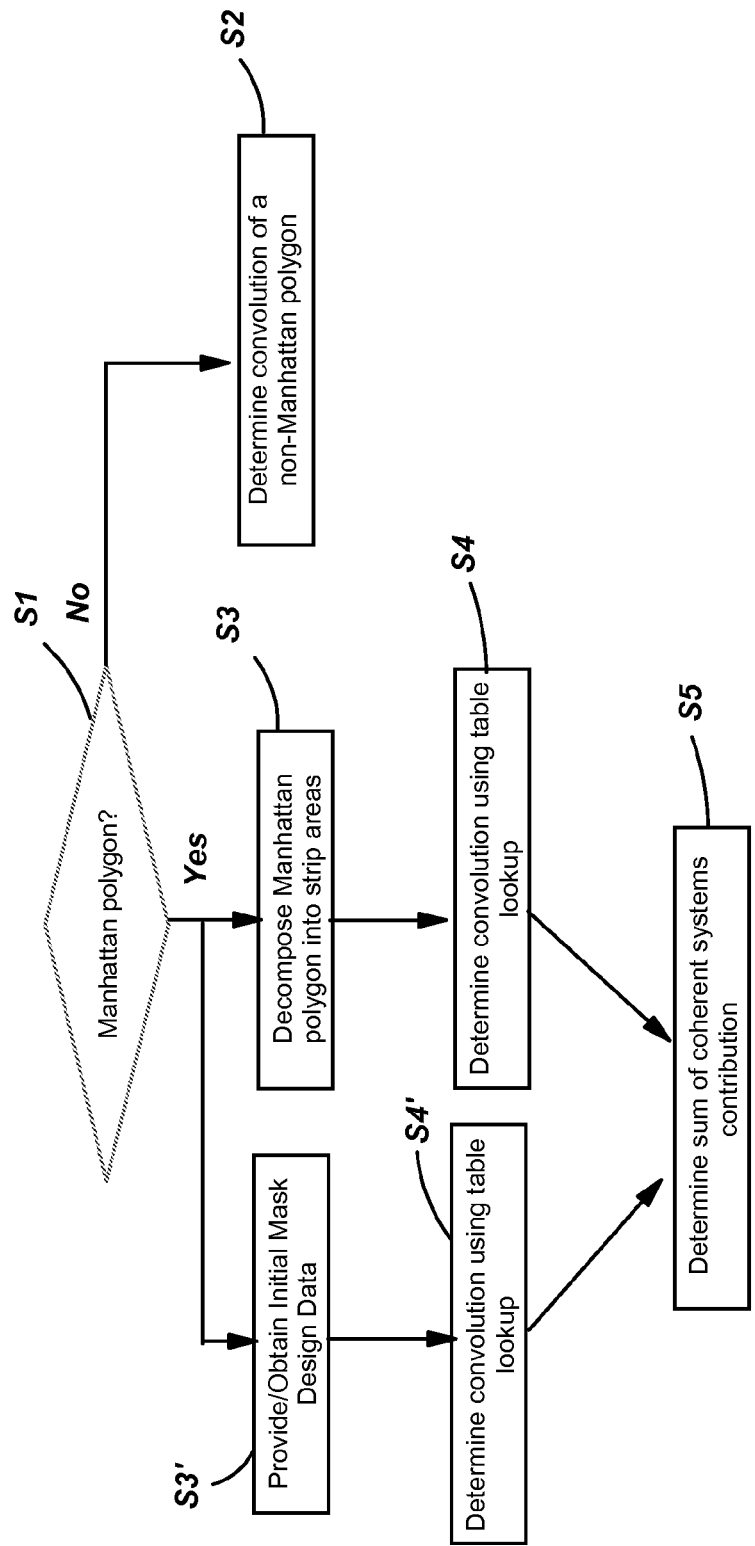
FIG. 3 shows embodiments of an operation of the image calculation system.

Embodiments of the operation of image calculation system 132 is shown in the flow diagram of FIG. 3. Referring to FIGS. 2-3, collectively, in process S1, operation controlling unit 141 determines whether a polygon feature in the input mask design is a Manhattan polygon or not. If the polygon feature is not a Manhattan polygon, "No", operation controlling unit 141 directs the operation to process S2; if the polygon feature is a Manhattan polygon, "Yes", operation controlling unit 141 directs the operation to process S3 or S3'.

In process S2, substitute convolution determining unit 142 determines a convolution for the non-Manhattan polygon using any now-available or later-developed methods. As the details of process S2 is not required for the appreciation of the current disclosure, no further description will be provided for brevity.

Figure 4:
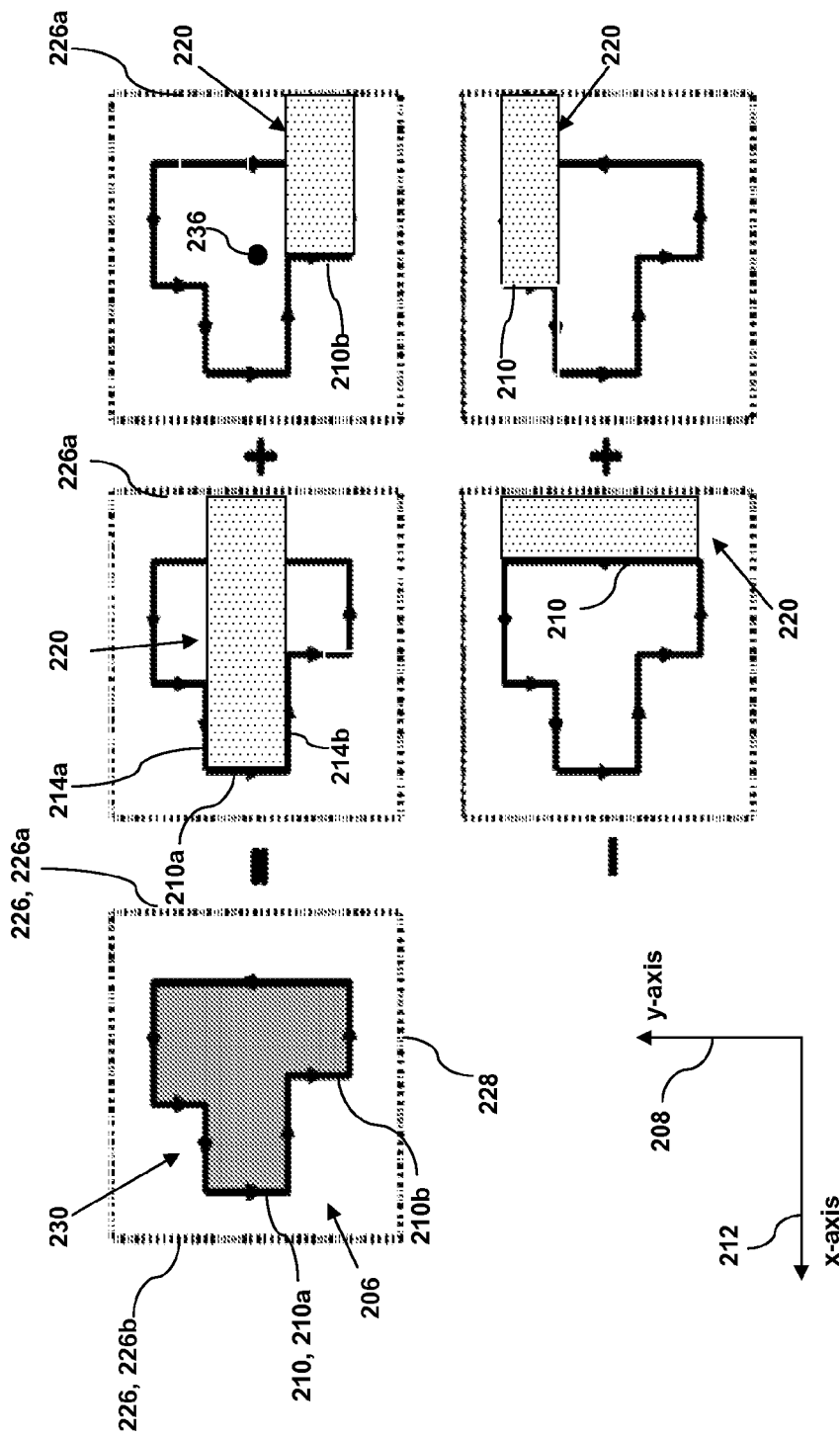
FIG. 4 shows decomposing a Manhattan polygon based on parallel edges only.

In processes S3, S3', Manhattan polygon decomposing unit 144 decomposes a Manhattan polygon of mask 104 into decomposed areas based on parallel edges of the Manhattan polygon along only one dimension. As shown in FIG. 4, edges of a Manhattan polygon 206 are either parallel along vertical dimension 208, i.e., edges 210, or parallel along horizontal dimension 212, i.e., edges 214. Edges parallel to either dimension 208 or 212 may be chosen as the basis for the decomposition and such a choice does not affect the operational methodology. That is, Manhattan polygon decomposing unit 144 may randomly select either edges 210 or edges 214 for the decomposition operation. In the description herein, the edges, e.g., edges 210, selected as the basis for the polygon decomposition are referred to as "parallel edges", and the edges, e.g., edges 214, not selected as the basis for the polygon decomposition are referred to as "perpendicular edges". In addition, in the description herein, the terms "parallel" and "perpendicular" are defined only with respect to a parallel edge 210. That is, once an edge of Manhattan polygon 206 is randomly chosen as a parallel edge, edges and boundaries parallel to the parallel edge 210 are referred to as "parallel" and edges and boundaries perpendicular to the parallel edge are referred to as "perpendicular". In the description herein, it is assumed that vertical edges 210 are selected as the basis for the decomposition operation and thus are the "parallel" edges. Manhattan polygon decomposing unit 144 may decompose Manhattan polygon 206 using two schemes in processes S3 and S3', respectively.

In process S3, parallel edge only decomposer 146 may decompose Manhattan polygon 206 into strip areas 220 each defined by a respective parallel edge 210 (FIG. 4). As shown in FIG. 4, strip areas 220 each extending from the respective parallel edge 210 toward a same parallel boundary 226 (as shown in FIG. 4, parallel boundary 226a) of the respective region of interest 224 (shown in dotted lines). The phrase "same parallel boundary" represents that in the decomposition, all resulted strip area/element, and/or quarter-plane area/element extend to the same (randomly selected) parallel boundary 226 of a region of interest (ROI) 224. Region of interest 224 includes two parallel boundaries 226 (226a, 226b) that are parallel to parallel edges 210. Parallel edge only decomposer 146 may choose to make strip areas 220 extend to either parallel boundary 226. The choice of either parallel boundary 226 does not affect the operational methodology. In this description, the phrase "extending toward" does not mean that strip area 220 necessarily terminates at parallel boundary 226. Strip areas 220 may extend indefinitely provided that the direction is from parallel edge 210 toward parallel boundary 226. Strip areas 220 are rectangular (including square) if indefiniteness is treated as an edge of strip area 220.

Figure 1:
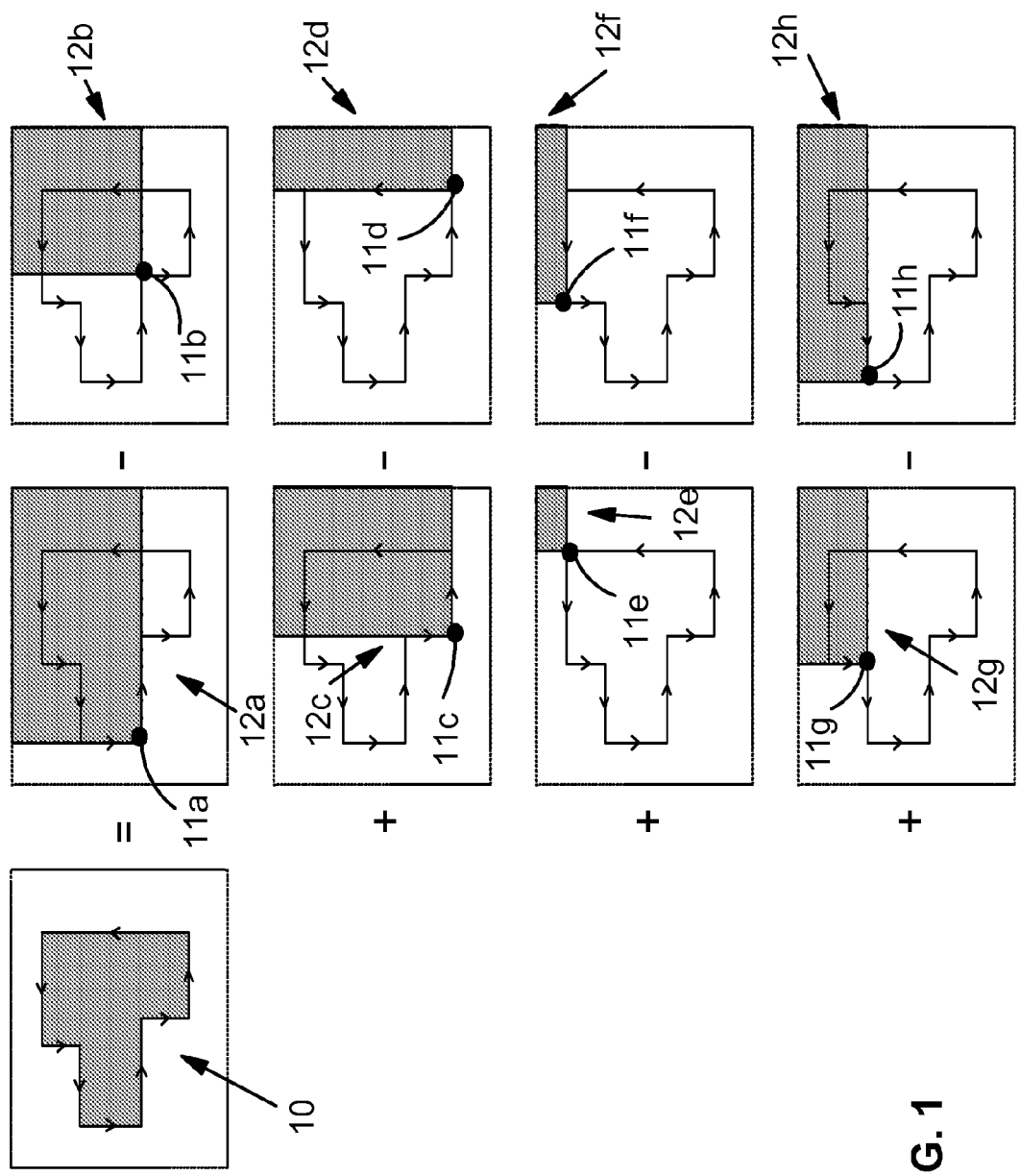
FIG. 1 shows a conventional corner table lookup scheme.

As is appreciated, the decomposition scheme of Manhattan polygon 206 is directly related to a table lookup scheme. A table look-up scheme based on the polygon decomposition scheme of FIG. 4 is referred to as an edge segment table lookup scheme. Under the decomposition scheme shown in FIG. 4, the number of table lookups decreases to a half as compared to that of FIG. 1, although the lookup table for one SOCS kernel will be increased from two dimensional (2-D) to 3-D: x- and y-coordinates of the starting point (of a parallel edge 210) as well as the length of the edge 210. Since the length of parallel edges 210 can be limited without much inefficiency, this additional dimension can be expected to be much smaller than the other two. Note that the rare long fragment could be split into pieces in order to restrain the length of the additional table dimension. Assume, for example, that the radius of ROI 224 is 1.6 um, the longest length of edges 210 is 200 nm and the grid distance is 10 nm, and that 10 kernels are considered in the SOCS calculation. Under these conditions, the edge segment table lookup scheme (see FIG. 4) will require that $(2\times160)\times(2\times160)\times20\times10=20{,}480{,}000$ points be stored in the tables, instead of $(2\times160)\times(2\times160)\times10=1{,}024{,}000$ points in the corner lookup scheme as shown in FIG. 1.

Since the increase of the table size is limited and the memory requirement is still under the non-RAM threshold for memory latency increase, the single lookup time of the new table lookup scheme will be similar to that of the conventional corner lookup scheme (FIG. 1) if other configurations are the same. However, the number of table lookups is decreased to one half. As such, the speed of SOCS calculation is increased.

Figure 5:
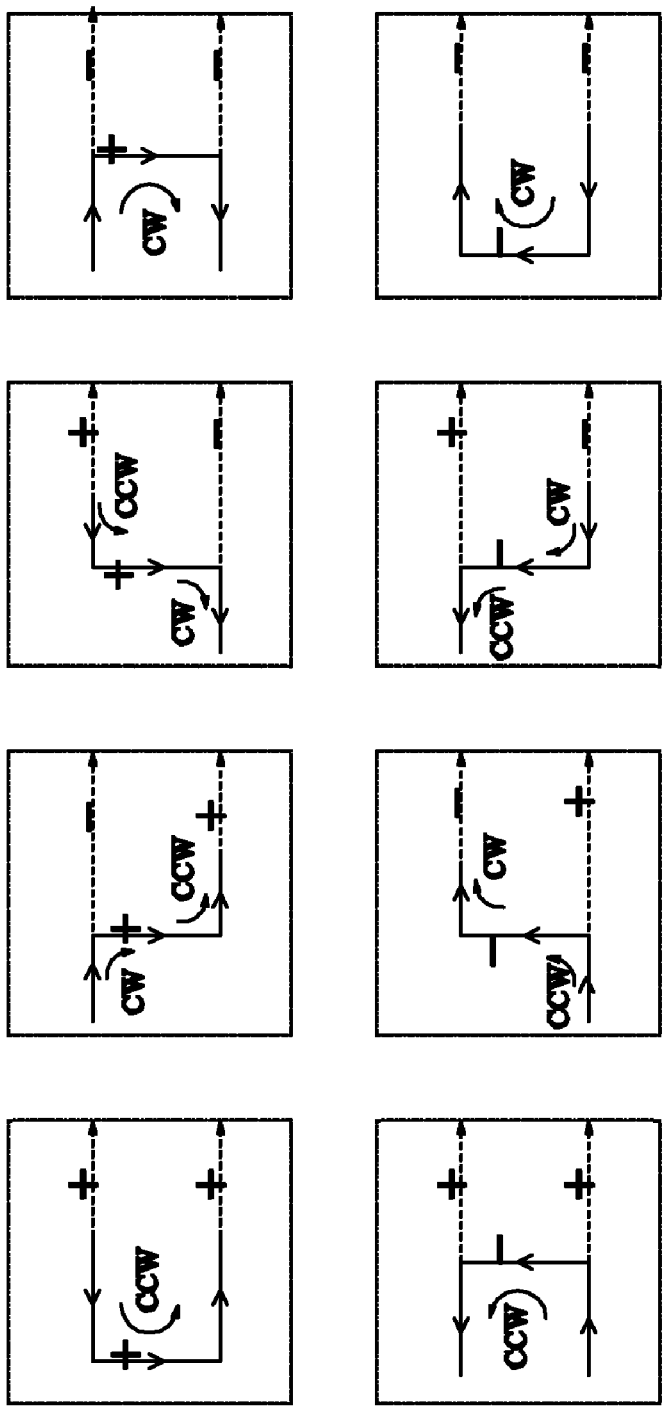
FIG. 5 shows table assignments of δ-function for an edge segment table lookup scheme.

Under the edge segment table lookup scheme, a new isofield method has been developed. First, a progress sequence 230 (also referred to as a direction of progress) (shown by arrows in FIG. 4) around all edges 210, 214 of Manhattan polygon 206 is randomly selected. There are only two choices of the progress sequences (i.e., clockwise or counter clockwise with respect to a center 236 of ROI 224) and the random selection of either one does not change the operational methodology. As shown in FIG. 4, it is assumed for description purposes that sequence 230 (counter clockwise, shown in arrows around Manhattan polygon 206) is randomly selected for the operation. Then, the table assignments for each strip 220 are defined by the direction of progress sequence 230 along the respective parallel edge 210 as well as the rotation direction (i.e., either clockwise (CW) or counter-clockwise (CCW)) from the immediately preceding perpendicular edge 214 to the parallel edge 210 and the rotation direction from the parallel edge 210 to the immediately subsequent (i.e., following) perpendicular edge 214. The terms "preceding" and "subsequent" are defined according to the randomly selected progress sequence 230. The stored convolutions (or sub-images) in each lookup table represent the convolutions of a SOCS kernel with an object that consists of strip area 220 combined with one of eight isofield edge configurations shown in FIG. 5. A separate set of eight tables (representing each of the eight isofield edge configurations) may be constructed for the convolution with each SOCS kernel.

The algorithm to determine which table assignment should be used for each particular parallel edge 210 (i.e., for the respective strip area 220) can be described in the following exemplary operation. In the following description, parallel edge 210a is used as an example of a starting point to illustrate the algorithm.

1) Determine a direction of progress sequence 230 along parallel edge 210. Here for parallel edge 210a, the direction is downward.
2) If the direction of the parallel edge 210 is:
   a. downward, the sign of δ-function (used herein according to the well known and accepted meaning in the art) is positive ("+") for this parallel edge 210, which represents that the convolution results between the respective strip 220 and the kernels will be added to the SOCS calculation; or
   b. upward, the sign of δ-function is negative ("−") for this parallel edge 210, which represents that the convolution results between strip 220 and the kernels will be subtracted from the SOCS calculation.
   Here, for parallel edge 210a, the sign of δ-function is positive.
3) If the rotation direction from the immediately preceding perpendicular edge 214 to this parallel edge 210 is:
   a. counter clockwise (CCW), the sign of δ-function is positive for the preceding perpendicular edge 214 and continues rightward to boundary 226a of ROI 224; or
   b. clockwise (CW), the sign of δ-function is negative for the preceding perpendicular edge 214 and continues rightward to boundary 226a of ROI 224.
   Here, for parallel edge 210a, the sign of δ-function for preceding perpendicular edge 214a is positive as the rotation direction from preceding perpendicular edge 214a to parallel edge 210a is counter clockwise.
4) If the direction from parallel edge 210 to the immediately subsequent perpendicular edge 214 is:
   a. counter clockwise (CCW), the sign of δ-function is positive for the immediately subsequent perpendicular edge 214 and continues rightward to boundary 226a of ROI 224; or
   b. clockwise (CW), the sign of δ-function is negative for the immediately subsequent perpendicular edge 214 and continues rightward to boundary 226a of ROI 224.
   Here, for parallel edge 210a, the sign of δ-function for immediately subsequent perpendicular edge 214b is positive as the rotation direction from parallel edge 210a to perpendicular edge 214b is counter clockwise.
5) Move to the next parallel edge 210b along sequence 230, repeat 1) to 4) until all parallel edges 210 and the related immediately preceding and subsequent perpendicular edges 214 are tagged.

Figure 6:
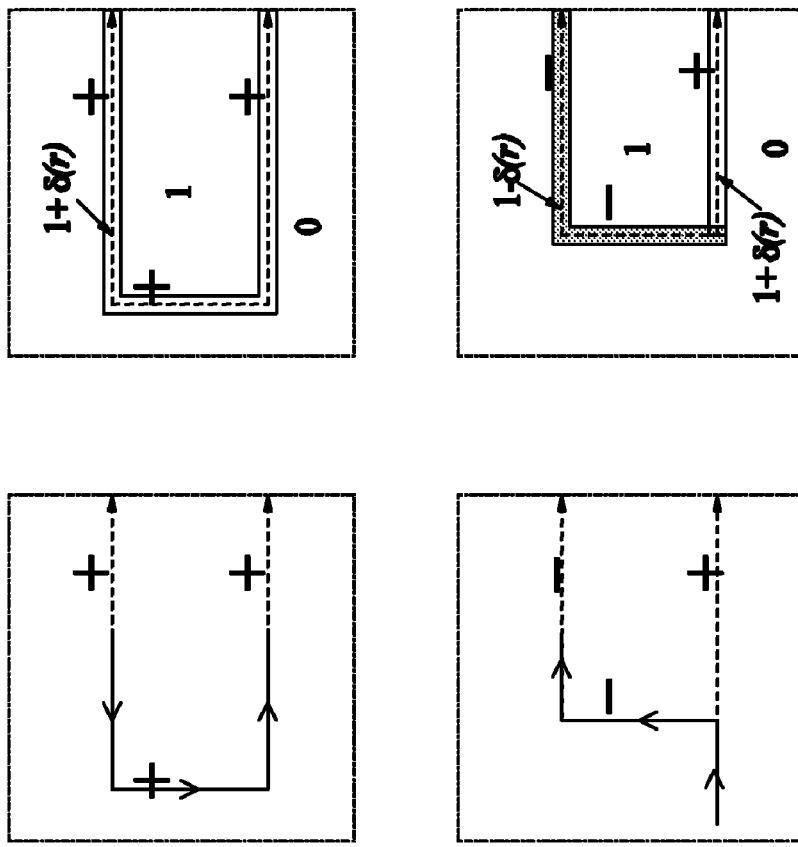
FIG. 6 shows advantages of the edge segment table lookup scheme in solving electromagnetic effects.

After the sign of δ-function at each edge (parallel edge 210, perpendicular edge 214) is determined, in process S4, table lookup unit 150 may obtain the mask function used in lookup table pre-computation to convolve with the kernels. As shown in FIG. 6, the δ-function convolution along edges 210, 214 will compensate the error caused by neglecting an exact EMF treatment of mask topography, which is appreciable in the art based on the above description.

As described above, representing a Manhattan polygon 10 as a superposition of corners (FIG. 1) in the conventional approaches is inefficient, since one degree of freedom in each corner 11 has already been used in the previous corner. The edge segment lookup scheme (based on the parallel edge based decomposition, FIGS. 4-5) can decrease the number of table lookups to one half without dramatically increasing the size of the table.

Figure 7:
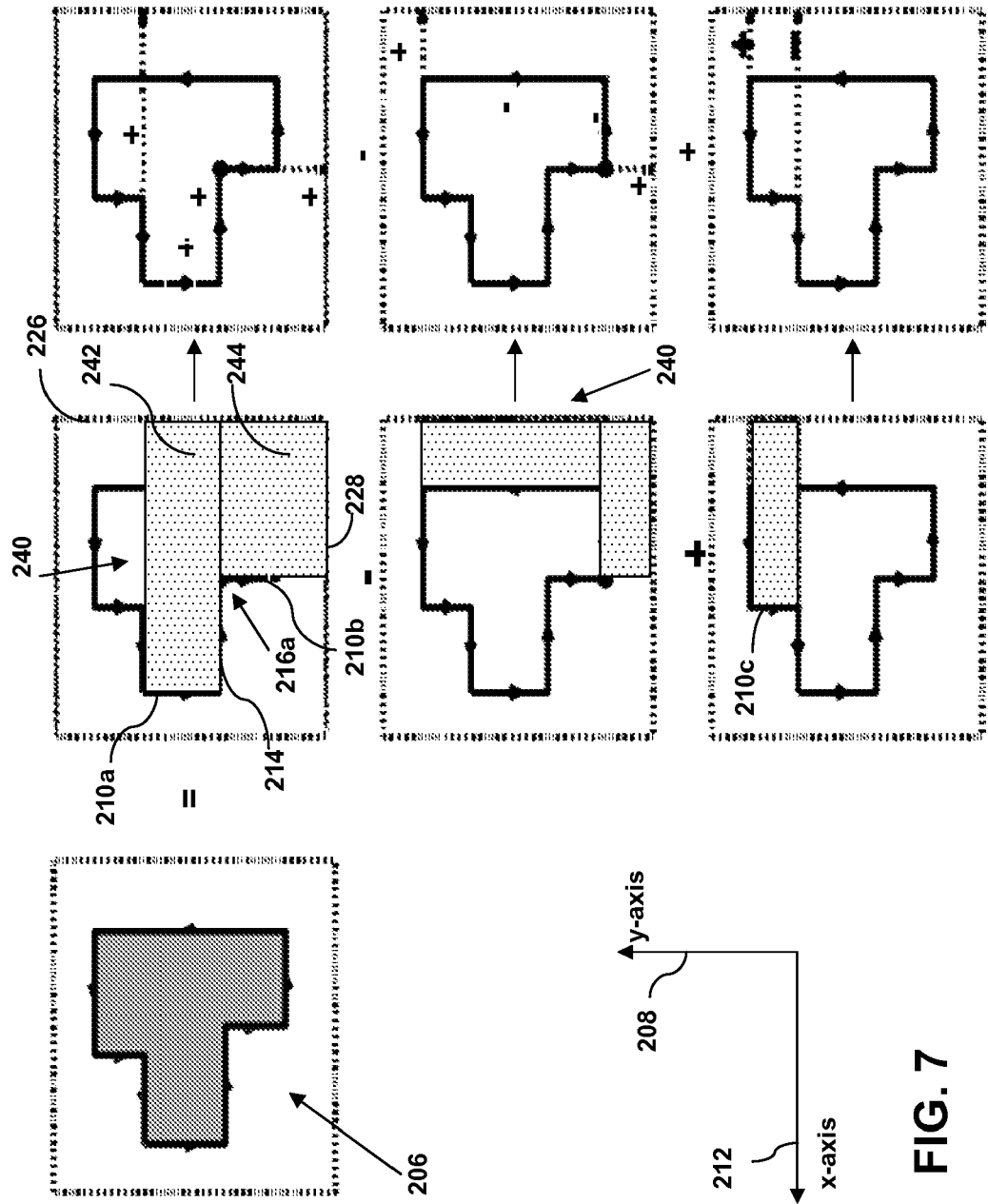
FIG. 7 shows decomposing a Manhattan polygon based on a parallel edge and an adjacent corner.

Further pursuing this concept, according to an alternative embodiment, in process S3', parallel edge plus corner decomposer 148 may decompose Manhattan polygon 206 based on a parallel edge 210 and an immediately adjacent corner 216 (FIG. 7) (by definition adjacent corner 216 is not included in the edge 210) of Manhattan polygon 206. The immediately adjacent corner 216 may be either a preceding corner or a subsequent corner with respect to progress sequence 230. FIG. 7 shows the parallel edge plus corner decomposition scheme. As shown in FIG. 7, a resulted decomposed area 240 includes a strip area 242 extending from the respective parallel edge 210 to a same parallel boundary 226a of the respective region of interest 224 and a quarter plane area 244 extending from corner 216 to the same parallel boundary 226a and a perpendicular boundary 228, i.e., a quarter plane whose one corner is defined by corner 216.

Without loss of generality, it is assumed for description purposes that parallel edges 210 and adjacent corners 216 are used for the edge plus corner decomposition. As such, along progress sequence 230, the combinations of parallel edges 210 plus corners 216 change alternatively: e.g., if the first combination is edge+corner (referred to herein as "Combination I"), then the next combination will be corner+edge (referred to herein as "Combination II"). This decomposition scheme decreases the lookup times further to one third as the lookup table of the related table lookup scheme is increased by another dimension (totally four dimensions 4-D). For the exemplary case of parallel edge 210, the fourth dimension is x-coordinate of corner 216 (the y-coordinate of corner 216 is determined by the upper or lower points of the respective parallel edge 210). Following the exemplary case dimensions described above, the fourth dimension needs not be much larger than the third, e.g., −200 nm to 200 nm away from one of the two points of edge 210. So totally (2×160)×(2×160)×

20×(2×40)×10=1,638,400,000 points are stored, which can be reduced by further exploiting the symmetry of the mask.

As shown in FIG. 7, it is possible that at the end of sequence 230, there is only one parallel edge 210 or one corner 216 left when closing Manhattan polygon 206 (FIG. 7 shows one parallel edge 210c left). In such cases, the tables for the above described edge segment lookup scheme (3-D) (FIGS. 3-4) or a conventional corner lookup scheme (2-D) (FIG. 1) may need to be employed to finish the SOCS calculation.

For the table lookup scheme established based on the edge plus corner decomposition scheme (referred to herein as "edge segment+corner table lookup scheme"), when EMF is considered, 16 different table assignments are required to cover all different configurations that may be encountered during the SOCS calculation.

The algorithm to determine which table assignment should be used for each decomposed area 240 (decomposed based on the respective parallel edge 210 and corner 216) can be illustratively described as follows using progress sequence 230:

1) Selecting (randomly) a starting parallel edge 210 plus corner 216 combination and determine the type of the combination, i.e., Combination I or Combination II.
   For illustration purposes, it is assumed that parallel edge 210a and corner 216a (Combination I: edge segment+corner) is selected as the starting combination.
2) Determine a direction of progress sequence 230 along the parallel edge 210. Here for parallel edge 210a, the direction is downward.
3) If the direction along the parallel edge is:
   a. downward, the sign of δ-function is positive for this parallel edge 210 and the perpendicular edge 214 between the parallel edge 210 and the respective corner 216, which represents that the convolution of the decomposed area 240 addressed by this combination and the kernels will be added to the SOCS calculation; or
   b. upward, the sign of δ-function is negative for this parallel edge 210 and the perpendicular edge 214 between the parallel edge 210 and the corner 216, which represents that the convolution of area 240 addressed by this combination and the kernels will be subtracted from the SOCS calculation.
   Here, for the combination of parallel edge 210a and corner 216a, the sign of δ-function is positive for parallel edge 210a and the perpendicular edge 214 between parallel edge 210a and corner 216a.
4) If the corner 216 has the same vertical coordinate as:
   a. the upper point of the parallel edge, the quarter-plane area 244 created by corner 216 has a negative sign, which is inversed as strip area 242 created by parallel edge 210, which represents that the strip area 242 will be added to the SOCS calculation, while the quarter-plane area 244 will be subtracted from the SOCS calculation; or
   b. the lower point of parallel edge 210, the quarter-plane area 244 created by corner 216 has a positive sign, which is the same as strip area 242 created by parallel edge 210.
   Here, for the combination of parallel edge 210a and corner 216a, quarter-plane area 244 has a positive sign, as corner 216a has the same vertical coordinate as the lower point of parallel edge 210a.
5) If Combination I:
   a. If the direction from the preceding perpendicular edge 214 to the parallel edge 210 is:
      i. counter clockwise (CCW), the sign of δ-function is positive for the preceding perpendicular edge 214 and continues rightward to the same parallel boundary 226a of ROI 224; or
      ii. clockwise (CW), the sign of δ-function is negative for the preceding perpendicular edge 214 and continues rightward to the parallel boundary 226a of ROI 224.
   b. If the following parallel edge 210 (not used in an edge+corner combination as it originates from corner 216) originating from the corner 216 is along:
      i. the same direction as the parallel edge 210a in the combination, here 210a, the sign of δ-function is positive for the following parallel edge 210 and continues downward to perpendicular boundary 228 of ROI 224; or
      ii. the inversed direction as the parallel edge 210a in the combination, the sign of δ-function is negative for the following parallel edge 210 and continues downward to the perpendicular boundary 228 of ROI 204.
   Here, for the combination of parallel edge 210a and corner 216a, the sign of δ-function is positive for the following parallel edge 210b and continues downward to perpendicular boundary 228 of ROI 224 as parallel edge 210b has the same progress sequence 230 direction as parallel edge 210a.
6) If Combination II:
   a. If the preceding parallel edge 210 ending to the corner is along:
      i. the same direction as the parallel edge 210 in the combination, the sign of δ-function is negative for the preceding parallel edge 210 and continues downward to perpendicular boundary 228 of ROI 224; or
      ii. the inversed direction as the parallel edge 210 in the combination, the sign of δ-function is positive for the preceding parallel edge 210 and continues downward to perpendicular boundary 228 of ROI 224.
   b. If the direction from parallel edge 210 to the following perpendicular edge 214 is:
      i. CCW, the sign of δ-function is positive for the following perpendicular edge 214 and continues rightward to boundary 226a of ROI 224; or
      ii. CW, the sign of δ-function is negative for the following perpendicular edge 214 and continues rightward to boundary 226a of ROI 224.
   Combination II does not fit the combination of parallel edge 210a and corner 216a.
7) Move to the next combination which will be of a different type as the previous combination, until less than three corners 216 are left.
8) Close the progress of progress sequence 230 around Manhattan polygon 206, if:
   a. two corners 216 are left, use the edge segment lookup scheme (FIGS. 4-5) to determine the signs of δ-function, as there must be a parallel edge 210 between the two corners 216;
   b. one corner 216 is left, use the conventional corner lookup scheme to determine the sign of S-function; or
   c. no corner 216 is left, all the combinations and edges (210, 214) have already been tagged.

After the sign of δ-function at each combination and edge 210/214 is determined, in process S4', table lookup unit 150 may obtain the mask function used in lookup table pre-computation to convolve with the kernels, as shown in the right side of FIG. 7.

In process S5, combining unit 152 determines the sum of coherent systems contribution of polygon 206 by combining the coherent sub-images obtained in process S4 or/and S4' to generate the full image. As appreciated, a coherent sub-image may be added or subtracted from the mask plane according to the "+" or "−" δ-function signs.

It should be appreciated that all the directional references, e.g., clockwise/counter clockwise, downward/upward, rightward/leftward, used in the descriptions herein are for illustrative purposes. Various combinations of the directions are possible in the Manhattan polygon decomposition schemes/table lookup schemes and the scope of the invention is not limited by any specific direction combination.

3. Conclusion

While shown and described herein as a method and system for calculating image intensity for a mask used in integrated circuit processing, it is understood that the disclosure further provides various alternative embodiments. For example, in an embodiment, the disclosure provides a program product stored on a computer-readable medium, which when executed, enables a computer infrastructure to calculate image intensity for a mask used in integrated circuit processing. To this extent, the computer-readable medium includes program code, such as image calculation system 132 (FIG. 2), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 112 (FIG. 2) and/or storage system 122 (FIG. 2), and/or as a data signal traveling over a network (e.g., during a wired/wireless electronic distribution of the program product).

It should be appreciated that the teachings of the present disclosure could be offered as a business method on a subscription or fee basis. For example, a system 100, a computing device 104 comprising image calculation system 132 (FIG. 2) could be created, maintained and/or deployed by a service provider that offers the functions described herein for customers. That is, a service provider could offer to provide a service to calculate image intensity for a mask used in integrated circuit processing as described above.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

What is claimed is:

1. A method for calculating image intensity for a mask used in integrated circuit processing, the method comprising:
   decomposing a Manhattan polygon of the mask into decomposed areas based on parallel edges of the Manhattan polygon along only one dimension;
   determining a convolution of each decomposed area based on a table lookup;
   determining a sum of coherent systems contribution of the Manhattan polygon based on the convolutions of the decomposed areas; and
   outputting the determined sum of coherent system contribution for analyzing the mask.

2. The method of claim 1, wherein the Manhattan polygon is decomposed into strip areas, each strip area extending from one parallel edge to a same parallel boundary of a respective region of interest.

3. The method of claim 2, further comprising determining a sign of a δ-function for a parallel edge based on a direction of a progress sequence around edges of the Manhattan polygon along the parallel edge, and determining signs and extensions of δ-functions along a preceding perpendicular edge and a subsequent perpendicular edge immediately adjacent to the parallel edge based on rotation orientations of the progress sequence between the preceding perpendicular edge and the parallel edge and between the parallel edge and the subsequent perpendicular edge, respectively.

4. The method of claim 1, wherein the decomposing includes decomposing the Manhattan polygon based on a parallel edge and an immediately adjacent corner of the Manhattan polygon.

5. The method of claim 4, wherein a resulted decomposed area includes a strip area extending from the parallel edge to a parallel boundary of a respective region of interest and a quarter plane area extending from the corner to the parallel boundary and a perpendicular boundary of the respective region of interest.

6. The method of claim 5, further comprising determining a sign of a δ-function for the parallel edge and a perpendicular edge between the parallel edge and the corner based on a direction of a progress sequence around edges of the Manhattan polygon along the parallel edge, and determining a sign of the quarter plane area based on a relative position of the corner to the two ends of the parallel edge.

7. The method of claim 5, in the case the corner is subsequent to the parallel edge in a progress sequence around edges of the Manhattan polygon, further comprising:
   determining a sign and extension of a δ-function for a perpendicular edge immediately preceding the parallel edge based on a rotation orientation of the progress sequence between the preceding perpendicular edge and the parallel edge; and
   determining a sign and extension of a δ-function for a different parallel edge immediately subsequent to the corner based on a direction of the progress sequence along the different parallel edge relative to a direction of the progress sequence along the parallel edge.

8. The method of claim 5, in the case the corner precedes the parallel edge in a progress sequence around edges of the Manhattan polygon, further comprising:
   determining a sign and extension of a δ-function for a different parallel edge immediately preceding the corner based on a direction of the progress sequence along the different parallel edge relative to a direction of the progress sequence along the parallel edge; and
   determining a sign and extension of a δ-function for a perpendicular edge immediately subsequent to the parallel edge based on a rotation orientation of the progress sequence between the parallel edge and the subsequent perpendicular edge.

9. A system for calculating image intensity for a mask used in integrated circuit processing, the system comprising:
   at least one computing device comprising;
   a Manhattan polygon decomposing unit for decomposing a Manhattan polygon of the mask into decomposed areas based on parallel edges of the Manhattan polygon along only one dimension;
   a table lookup unit for determining a convolution of each decomposed area based on a table lookup; and
   a combining unit for determining a sum of coherent systems contribution of the Manhattan polygon based on the convolutions of the decomposed areas.

10. The system of claim 9, wherein the Manhattan polygon decomposing unit decomposes the Manhattan polygon into strip areas, each strip area extending from one parallel edge to a same parallel boundary of a respective region of interest.

11. The system of claim 10, wherein the Manhattan polygon decomposing unit includes a parallel edge only decomposer for determining a sign of a δ-function for a parallel edge based on a direction of a progress sequence around edges of the Manhattan polygon along the parallel edge, and for determining signs and extensions of δ-functions for a preceding perpendicular edge and a subsequent perpendicular edge immediately adjacent to the parallel edge based on rotation orientations of the progress sequence between the preceding perpendicular edge and the parallel edge and between the parallel edge and the subsequent perpendicular edge, respectively.

12. The system of claim 9, wherein the Manhattan polygon decomposing unit decomposes the Manhattan polygon based on a parallel edge and an immediately adjacent corner of the Manhattan polygon.

13. The system of claim 12, wherein a resulted decomposed area includes a strip area extending from the parallel edge to a parallel boundary of a respective region of interest and a quarter plane area extending from the corner to the parallel boundary and a perpendicular boundary of the respective region of interest.

14. The system of claim 13, wherein the Manhattan polygon decomposing unit includes a parallel edge plus corner decomposer for determining a sign of a δ-function for the parallel edge and a perpendicular edge between the parallel edge and the corner based on a direction of a progress sequence around edges of the Manhattan polygon along the parallel edge, and for determining a sign of the quarter plane area based on a relative position of the corner to the two ends of the parallel edge.

15. The system of claim 13, wherein in the case the corner is subsequent to the parallel edge in a progress sequence around edges of the Manhattan polygon, the parallel edge plus corner decomposer:
   determines a sign and extension of a δ-function for a perpendicular edge immediately preceding the parallel edge based on a rotation orientation of the progress sequence between the preceding perpendicular edge and the parallel edge; and
   determines a sign and extension of a δ-function for a different parallel edge immediately subsequent to the corner based on a direction of the progress sequence along the different parallel edge relative to a direction of the progress sequence along the parallel edge.

16. The system of claim 13, wherein in the case the corner precedes the parallel edge in a progress sequence around edges of the Manhattan polygon, the parallel edge plus corner decomposer:
   determines a sign and extension of a δ-function for a different parallel edge immediately preceding the corner based on a direction of the progress sequence along the different parallel edge relative to a direction of the progress sequence along the parallel edge; and
   determines a sign and extension of a δ-function for a perpendicular edge immediately subsequent to the parallel edge based on a rotation orientation of the progress sequence between the parallel edge and the subsequent perpendicular edge.

17. A computer program product for calculating image intensity for a mask used in integrated circuit processing, comprising computer usable program code stored in a non-transitory computer readable medium, which, when executed by a computer system, enables the computer system to:
   decompose a Manhattan polygon of the mask into decomposed areas based on parallel edges of the Manhattan polygon along only one dimension;
   determine a convolution of each decomposed area based on a table lookup;
   determine a sum of coherent systems contribution of the Manhattan polygon based on the convolutions of the decomposed areas; and
   output the determined sum of coherent system contribution for analyzing the mask.

18. The program product of claim 17, wherein the program code is configured to enable the computer system to decompose the Manhattan polygon into strip areas, each strip area extending from one parallel edge to a same parallel boundary of a respective region of interest, and the program code is configured to enable the computer system to determine a sign of a δ-function for a parallel edge based on a direction of a progress sequence around edges of the Manhattan polygon along the parallel edge, and to determine signs and extensions of δ-functions for a preceding perpendicular edge and a subsequent perpendicular edge immediately adjacent to the parallel edge based on rotation orientations of the progress sequence between the preceding perpendicular edge and the parallel edge and between the parallel edge and the subsequent perpendicular edge, respectively.

19. The program product of claim 17, wherein the program code is configured to enable the computer system to decompose the Manhattan polygon based on a parallel edge and an immediately adjacent corner of the Manhattan polygon, wherein a resulted decomposed area includes a strip area extending from the parallel edge to a parallel boundary of a respective region of interest and a quarter plane area extending from the corner to the parallel boundary and a perpendicular boundary of the respective region of interest.

20. The program product of claim 19, wherein the program code is further configured to enable the computer system to determine a sign of a δ-function for the parallel edge and a perpendicular edge between the parallel edge and the corner based on a direction of a progress sequence around edges of the Manhattan polygon along the parallel edge, and to determine a sign of the quarter plane area based on a relative position of the corner to the two ends of the parallel edge.

21. The program product of claim 19, wherein in the case the corner is subsequent to the parallel edge in a progress sequence around edges of the Manhattan polygon, the program code is configured to enable the computer system to:
    determine a sign and extension of a δ-function for a perpendicular edge immediately preceding the parallel edge based on a rotation orientation of the progress sequence between the preceding perpendicular edge and the parallel edge; and
    determine a sign and extension of a δ-function for a different parallel edge immediately subsequent to the corner based on a direction of the progress sequence along the different parallel edge relative to a direction of the progress sequence along the parallel edge.

22. The program product of claim 19, wherein in the case the corner precedes the parallel edge in a progress sequence around edges of the Manhattan polygon, the program code is configured to enable the computer system to:
    determine a sign and extension of a δ-function for a different parallel edge immediately preceding the corner based on a direction of the progress sequence along the different parallel edge relative to a direction of the progress sequence along the parallel edge; and
    determine a sign and extension of a δ-function for a perpendicular edge immediately subsequent to the parallel edge based on a rotation orientation of the progress sequence between the parallel edge and the subsequent perpendicular edge.

23. A table lookup system for calculating image intensity for a mask used in integrated circuit processing, the table lookup system comprising:
    a database storing pre-calculated coherent sub-images based on a Manhattan polygon decomposition scheme; and
    a table lookup engine which executes following a table lookup scheme established based on decomposing a Manhattan polygon of the mask into decomposed areas based on parallel edges of the Manhattan polygon along only one dimension wherein the table look up engine determines a convolution of each decomposed area.

24. The table lookup system of claim 23, wherein the table lookup scheme decomposes the Manhattan polygon into strip areas, each strip area extending from one parallel edge to a same parallel boundary of a respective region of interest, and determines a sign of a δ-function for a parallel edge based on a direction of a progress sequence around edges of the Manhattan polygon along the parallel edge, and determines signs and extensions of δ-functions for a preceding perpendicular edge and a subsequent perpendicular edge immediately adjacent to the parallel edge based on rotation orientations of the progress sequence between the preceding perpendicular edge and the parallel edge and between the parallel edge and the subsequent perpendicular edge, respectively.

25. The table lookup system of claim 23, wherein the table lookup scheme decomposes the Manhattan polygon based on a parallel edge and an immediately adjacent corner of the Manhattan polygon, wherein a resulted decomposed area includes a strip area extending from the parallel edge to a parallel boundary of a respective region of interest and a quarter plane area extending from the corner to the parallel boundary and a perpendicular boundary of the respective region of interest.

* * * * *